US008933845B2

(12) United States Patent
Kim et al.

(10) Patent No.: US 8,933,845 B2
(45) Date of Patent: Jan. 13, 2015

(54) DATA COMMUNICATION DEVICE

(75) Inventors: Changil Kim, Gyeonggi-Do (KR); Soyeon Lee, Gyeonggi-Do (KR); Yeomin Youn, Gyeonggi-Do (KR); Kyunghack Yi, Seoul (KR); Jin Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 450 days.

(21) Appl. No.: 13/086,764

(22) Filed: Apr. 14, 2011

(65) Prior Publication Data

US 2012/0064843 A1 Mar. 15, 2012

(30) Foreign Application Priority Data

Sep. 10, 2010 (KR) .................. 10-2010-0089087

(51) Int. Cl.
| | |
|---|---|
| *H01Q 1/12* | (2006.01) |
| *H01Q 1/00* | (2006.01) |
| *H01Q 1/42* | (2006.01) |
| *H04B 1/38* | (2006.01) |
| *H01Q 1/24* | (2006.01) |
| *H01Q 1/48* | (2006.01) |
| *H01Q 5/00* | (2006.01) |
| *H01Q 9/42* | (2006.01) |

(52) U.S. Cl.
CPC ............ *H04B 1/3838* (2013.01); *H01Q 1/243* (2013.01); *H01Q 1/245* (2013.01); *H01Q 1/48* (2013.01); *H01Q 5/0062* (2013.01); *H01Q 9/42* (2013.01); *H04B 1/3816* (2013.01)
USPC ........... 343/702; 343/841; 343/718; 343/720; 343/872; 455/83

(58) Field of Classification Search
CPC ............................. H04W 88/02; H01Q 1/24
USPC ..................................... 343/702, 841; 455/83
See application file for complete search history.

(56) References Cited

U.S. PATENT DOCUMENTS

| 7,479,041 | B1 * | 1/2009 | Chen ............................. 439/630 |
| 2005/0024275 | A1 * | 2/2005 | Jo et al. ......................... 343/702 |
| 2005/0122268 | A1 * | 6/2005 | Suzuki .......................... 343/702 |
| 2006/0220957 | A1 * | 10/2006 | Tanaka et al. ............. 343/700 R |
| 2008/0100519 | A1 * | 5/2008 | Ku ................................. 343/702 |
| 2008/0303724 | A1 * | 12/2008 | Hsieh et al. .................. 343/702 |
| 2009/0052142 | A1 * | 2/2009 | Brewer et al. ................ 361/721 |
| 2009/0273523 | A1 * | 11/2009 | Sakuma ................ 343/700 MS |
| 2010/0283691 | A1 * | 11/2010 | Su et al. ....................... 343/702 |
| 2011/0080326 | A1 * | 4/2011 | Won et al. .................... 343/702 |

* cited by examiner

*Primary Examiner* — Dameon E Levi
*Assistant Examiner* — Ricardo Magallanes
(74) *Attorney, Agent, or Firm* — Ked & Associates, LLP

(57) ABSTRACT

A communication device as disclosed herein may include a body, an antenna assembly provided in the body, and configured to transmit or receive wireless signals, and a circuit board connected to the antenna assembly and configured to process the wireless signals. The antenna assembly may include a carrier having at least one region that is dimensioned to be farther away from the body than other portions thereof, and a radiator provided on the at least one dimensioned region of the carrier and configured to receive or radiate electromagnetic waves corresponding to the wireless signals. The radiator may be positioned on the dimensioned region of the carrier such that a specific absorption rate (SAR) due to the antenna assembly is reduced.

15 Claims, 7 Drawing Sheets

US 8,933,845 B2

DATA COMMUNICATION DEVICE

CROSS-REFERENCE TO RELATED APPLICATION(S)

This application claims priority under 35 U.S.C. §119 to Korean Application No. 10-2010-0089087 filed on Sep. 10, 2010 in Korea, whose entire disclosure(s) is/are hereby incorporated by reference.

BACKGROUND

1. Field

The present disclosure relates to a data communication device having a wireless communication function.

2. Background

Mobile devices are electronic devices which are portable and have at least one of information input and/or output functions, a data storage function and the like.

As it becomes multifunctional, the mobile device can be allowed to capture still images or moving images, play music or video files, play games, receive broadcast and the like, so as to be implemented as an integrated multimedia player.

The mobile devices may be classified into devices having voice and telephony functions (for example, cellular or mobile phones) and devices without the same (for example, laptop computers).

Meanwhile, a dongle denotes an external peripheral device of a personal computer (PC), such as a desktop, a barebone, notebook and the like. In general, the dongle is used by being connected to various types of equipment, which support universal serial bus (USB) terminals. Especially, a dongle device, which provides voice and telephony functions, is being developed in recent time. Hence, several solutions to more improve the performance of the dongle device may be considered in association with wireless communications.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Figure 1:
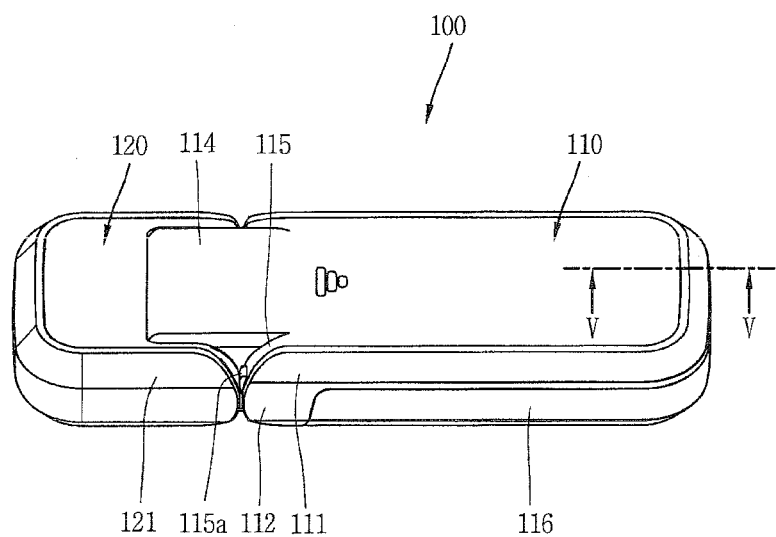
FIG. 1 is a perspective view showing a closed configuration of a dongle device in accordance with one exemplary embodiment.

Description will now be given in detail of preferred configurations of mobile devices according to the present disclosure, with reference to the accompanying drawings. Hereinafter, suffixes "module" and "unit or portion" for components used herein in description are merely provided only for facilitation of preparing this specification, and thus they are not granted a specific meaning or function.

This specification employs like/similar reference numerals for like/similar components irrespective of different embodiments, so they all will be understood by the first description. The expression in the singular form in this specification will cover the expression in the plural form unless otherwise indicated obviously from the context.

Figure 2:
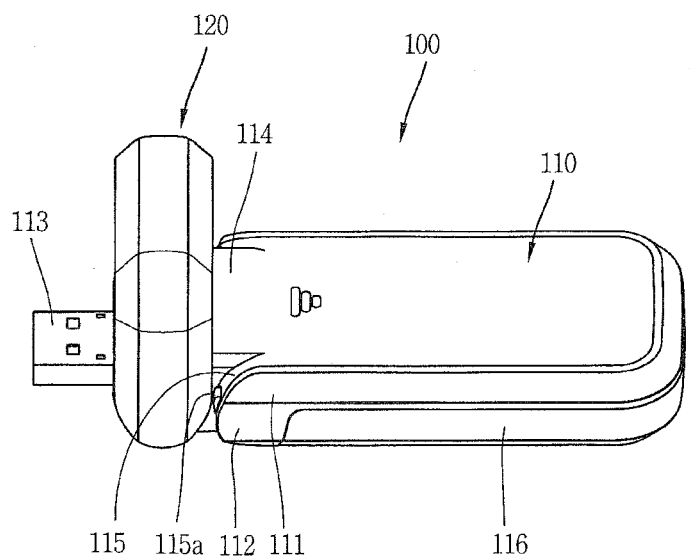
FIG. 2 is a perspective view showing an open configuration of the dongle device shown in FIG. 1.

FIG. 1 is a front perspective view showing a closed configuration of a data communication device 100, FIG. 2 is a front perspective view showing an open configuration of the data communication device 100 of FIG. 1. As shown in FIGS. 1 and 2, the data communication device 100 may include a body 110 and a cover body 120 rotatably coupled to each other. The data communication device 100 may be a mobile phone, a PDA, a pad, a laptop computer, a desktop computer, an external device such as a dongle device, or the like. Simply for ease of explanation, the data communication device 100 is disclosed herein as a dongle device. It should be appreciated, however, that the data communication device as embodied and broadly disclosed herein is not limited thereto.

Here, the present disclosure may not be limited to the type of dongle device shown in FIGS. 1 and 2 but applicable to a dongle device having a structure of two or more bodies being coupled in various manners to be relatively movable with each other or a dongle device having a single body.

The state shown in FIG. 2 that one side surface of the body 110 is externally exposed may be referred to as an open configuration, and the state shown in FIG. 1 that the exposed side surface of the body 110 is obscured by the cover body 120 may be referred to as a closed configuration.

As shown, the body 110 may have a bar-like shape, and include a case (casing, housing, cover, etc.) defining an outer appearance of the dongle device 100. This exemplary embodiment may illustrate a case divided into a front case 111 and a rear case 112. In addition, various electronic components may be disposed in a space between the front case 111 and the rear case 112. At least one intermediate case may additionally be disposed between the front case 111 and the rear case 112.

Further, the cases can be formed of resin in a manner of injection molding, or formed using metallic materials such as stainless steel (STS) and titanium (Ti).

An interface unit 113 (data interface) may be mounted to the body 110. The interface unit 113 may generally be implemented to interface the dongle device 100 with external devices. The interface unit 113 may be a data port of various types and configurations. For example, the interface unit 113 may allow a data reception from an external device, a power delivery to each component in the dongle device 100, or a data transmission from the dongle device 100 to an external device. The interface unit 170 may include, for example, wired/wireless headset ports, external charger ports, wired/wireless data ports, memory card ports, ports for coupling devices having an identification module, audio Input/Output (I/O) ports, video I/O ports, earphone ports, and the like.

The interface unit 113 may be configured to be attachable to a connection port of a portable device, and a representative example of the interface unit 113 may be a universal serial bus (USB) port. Examples of the portable device may include laptop computers, tablet PCs, digital broadcasting terminals, personal digital assistants (PDAs), portable multimedia players (PMPs), navigators, and the like.

More concretely, the interface unit 113 may be mounted to an end of the body 110, and the cover body 120 may be rotatably coupled to the body 110 based upon an axis in parallel to the interface unit 113 so as to open and close the interface unit 113.

The side surface of the body 110 may be shown having an antenna unit 130 or antenna assembly (see FIG. 3) for wireless communications or reception of broadcasting signals. The antenna unit 130 may be disposed in the body 110 to be adjacent to an end of the body 110, and transmit and receive wireless signals to allow wireless communications in a portable device having the body 110 connected thereto.

Referring to FIG. 2, an end of the body 110 is shown having a center part 114 and an edge part 115 (recessed surfaces).

The center part 114 is shown having the interface unit 113, and the edge part 115 may be recessed into the center part 114 toward the antenna unit 130 so as to be stepped with respect to the center part 114. That is, the center part 114 may protrude from the edge part 115.

As shown, the cover body 120 may be rotatably coupled to both side surfaces of the center part 114, and its rotation may be limited by the edge part 115. That is, the cover body 120 may include protrusion wings 121 each formed in a bar-like shape and protruding from the center part 114 to the edge part 115. Each of the protrusion wings 121 may have an end facing the edge part 115 and be coupled to the side surface of the center part 114 by a hinge.

Referring to FIG. 2, upon 90° rotation of the cover body 120, front surfaces of the protrusion wings 122 face the edge part 115, and the rotation of the cover body 120 may be limited by contact with the edge part 115. The edge part 115 may be in a curved shape, and include a protrusion 115a formed on the curved surface to be contactable with the front surface of the protrusion wing 121.

As the interface unit 113 is connected to a portable device in a state of the cover body 120 being rotated by 90°, a user may be restricted from being close to the body 110, which may allow reduction of a specific absorption rate (SAR).

The body 110 may be provided with an external card coupling unit 116 for coupling an external card to the dongle device 100. Examples of the external card may include subscriber identification module (SIM) or user identity module (UIM), a memory card for information storage and the like. The external card mounting unit 116 may be disposed at a rear side of the body 110.

The wireless communication of the dongle device 100 may be implemented by combination of the external card and the antenna unit 130. That is, the dongle device 100 may include one or more modules for allowing wireless communications between the dongle device 100 and a wireless communication system or between the dongle device 100 and a network, in which the dongle device 100 is located. For example, the dongle device 100 may include a broadcast receiving module, a mobile communication module, a wireless Internet module, a short-range communication module, a location information module and the like.

The broadcast receiving module receives a broadcast signal and/or broadcast associated information from an external broadcast managing entity via a broadcast channel.

The broadcast channel may include a satellite channel and a terrestrial channel. The broadcast managing entity may indicate a server which generates and transmits a broadcast signal and/or broadcast associated information or a server which receives a pre-generated broadcast signal and/or broadcast associated information and sends them to the portable terminal. The broadcast signal may be implemented as a TV broadcast signal, a radio broadcast signal, and a data broadcast signal, among others. The broadcast signal may further include a data broadcast signal combined with a TV or radio broadcast signal.

Examples of broadcast associated information may include information associated with a broadcast channel, a broadcast program, a broadcast service provider, and the like. The broadcast associated information may be provided via a mobile communication network, and received by the mobile communication module.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like.

The broadcast receiving module may be configured to receive digital broadcast signals transmitted from various types of broadcast systems. Such broadcast systems may include Digital Multimedia Broadcasting-Terrestrial (DMB-T), Digital Multimedia Broadcasting-Satellite (DMB-S), Media Forward Link Only (MediaFLO), Digital Video Broadcast-Handheld (DVB-H), Integrated Services Digital Broadcast-Terrestrial (ISDB-T) and the like. The broadcast receiving module may be configured to be suitable for every broadcast system transmitting broadcast signals as well as the digital broadcasting systems.

Broadcast signals and/or broadcast associated information received via the broadcast receiving module may be stored in a suitable device, such as a memory.

The mobile communication module transmits/receives wireless signals to/from at least one of network entities (e.g., base station, an external portable terminal, a server, etc.) on a mobile communication network. Here, the wireless signals may include audio call signal, video (telephony) call signal, or various formats of data according to transmission/reception of text/multimedia messages.

The wireless Internet module supports wireless Internet access for the portable terminal. This module may be internally or externally coupled to the dongle device 100. Examples of such wireless Internet access may include Wireless LAN (WLAN) (Wi-Fi), Wireless Broadband (Wibro), Worldwide Interoperability for Microwave Access (Wimax), High Speed Downlink Packet Access (HSDPA) and the like.

The short-range communication module denotes a module for short-range communications. Suitable technologies for implementing this module may include BLUETOOTH™, Radio Frequency IDentification (RFID), Infrared Data Association (IrDA), Ultra-WideBand (UWB), ZigBee, and the like.

The location information module denotes a module for detecting or calculating a position of a portable terminal. An example of the position location module 115 may include a Global Position System (GPS) module.

The wireless communication functions may be implemented responsive to transmission and reception of wireless signals by the dongle device 100. The present disclosure provides a specific absorption rate (SAR) reducing mechanism capable of reducing the SAR due to the wireless signals with maintaining wireless efficiency. Hereinafter, the SAR reducing mechanism will be described more concretely.

Figure 3:
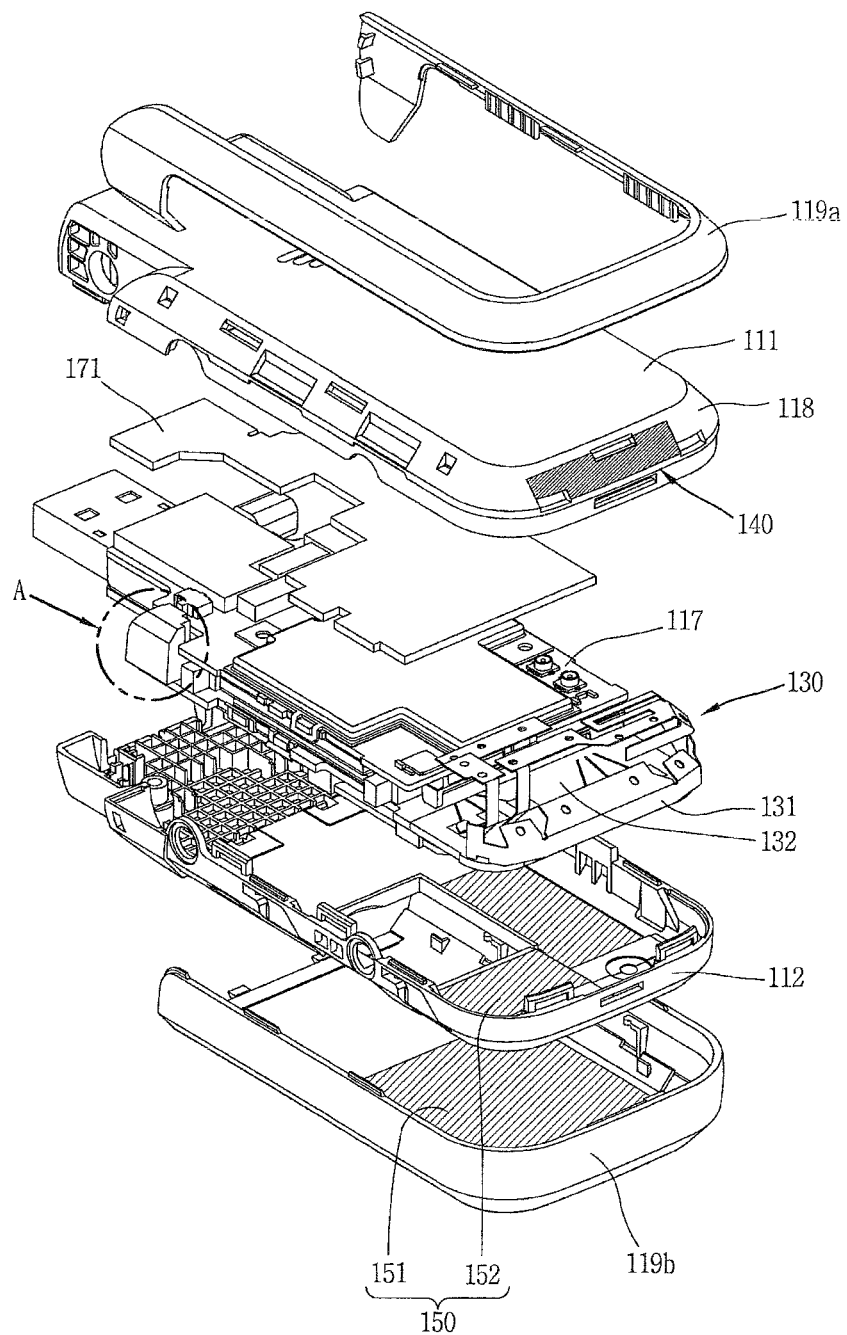
FIG. 3 is a partially disassembled view of the dongle device shown in FIG. 1.
Figure 4:
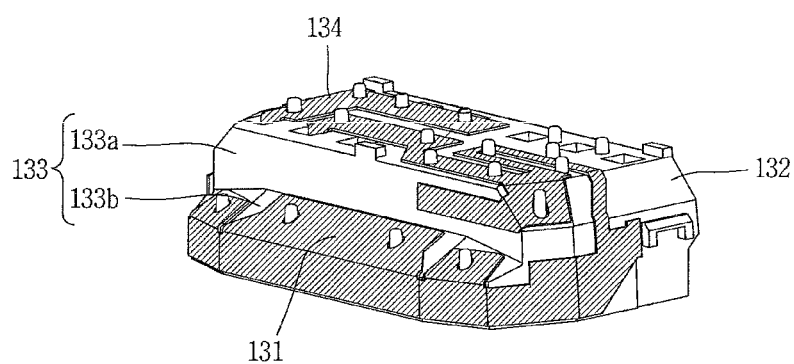
FIG. 4 is an enlarged view of an antenna unit of FIG. 3.
Figure 5:
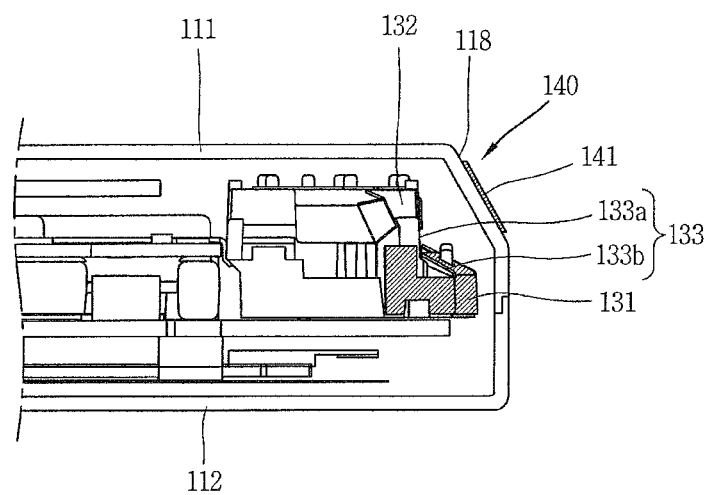
FIG. 5 is a sectional view of the dongle device taken along the line V-V of FIG. 1.
Figure 6:
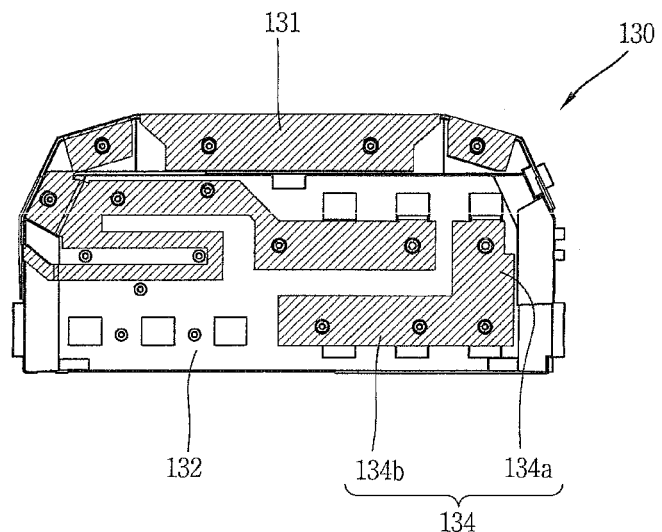
FIG. 6 is a planar view of the antenna unit of FIG. 3.
Figure 7:
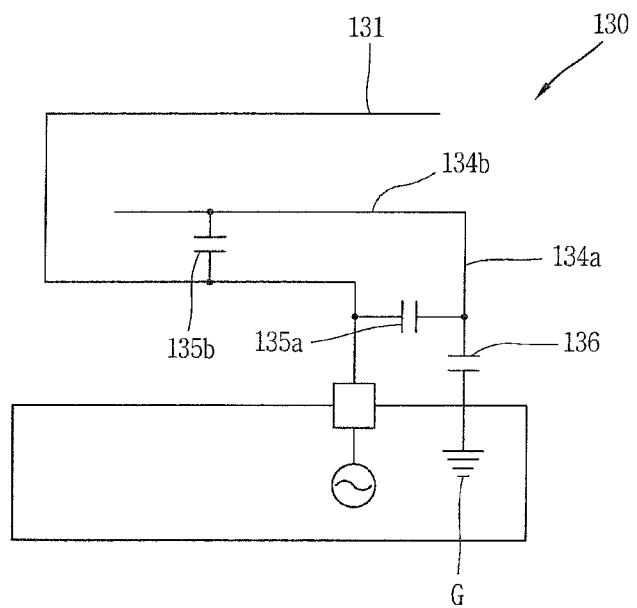
FIG. 7 is an equivalent circuit view of the antenna unit of FIG. 6.

FIG. 3 is a partially disassembled view of the dongle device 100 shown in FIG. 1, FIG. 4 is an enlarged view of the antenna unit 130 of FIG. 3, FIG. 5 is a sectional view of the dongle device 100 taken along the line V-V of FIG. 1, FIG. 6 is a planar view of the antenna unit 130 of FIG. 3, and FIG. 7 is an equivalent circuit view of the antenna unit of FIG. 6.

As shown in those drawings, a circuit board 117 may be disposed in an inner space formed between the front case 111 and the rear case 112. The circuit board 117 may be connected to the antenna unit 130 so as to process wireless signals transmitted from or received in the antenna unit 130. The circuit board 117 may be connected to the interface unit 113.

The antenna unit 130 may be disposed adjacent to an end of the body 110, opposite to the interface unit 113, and include a radiator 131 (conductor) and a carrier 132 (antenna assembly body).

The radiator 131 may be configured to receive or radiate (or emit) electromagnetic waves corresponding to wireless signals. The radiator 131 may be formed of a conductive material, for example, a metallic thin film of gold, copper and the like. The radiator 131 may be patterned to be able to transmit and receive wireless electromagnetic waves, and disposed adjacent to ends of the front and rear cases 111 and 112. Accordingly, the wireless electromagnetic waves may usually be sent or received via the ends of the front and rear cases 111 and 112.

The carrier 132 may be formed or dimensioned such that the radiator 131 may be placed on at least one surface thereof. The carrier 132 may include a through hole for inserting the radiator 131 therethrough. One end of the radiator 131 may be inserted through the through hole to be curved toward the circuit board 117. The curved portion may form a power feeding terminal electrically connected to the circuit board 117, such that power can be fed to the radiator 131 from the circuit board 117.

Referring to FIGS. 4 and 5, the carrier 132 may be configured such that at least a portion thereof is recessed to be farther away from the front case 111 than another portion thereof, thus reducing the SAR due to the antenna portion 130 around the body 110. In other words, the carrier 132 may include at least one dimensioned region such that a radiator 131 positioned on the dimensioned region is positioned farther away from the body 110 than the other regions of the carrier 132.

In more detail, a front surface and side surfaces of the carrier 132 may be connected by virtue of a corner part 133 (dimensioned or recessed region). The corner part 133 may be recessed in a direction to be farther away from the front case 111. The corner part 133 may face an end of the body 110 and include a perpendicular surface 133a and an inclination surface 133b.

The perpendicular surface 133a indicates a surface perpendicular to the front surface of the carrier 132, and the inclination surface 133b may connect the perpendicular surface 133a to the side surfaces of the carrier 132 and be inclined with respect to the front surface and the side surfaces. That is, the inclination surface 133b may be stepped from the front surface and form a stepped portion along a length of the perpendicular surface 133a.

The body 110 may have a front surface, a rear surface and side surfaces. An inclination portion 118 facing the corner part 133 may be formed between the front surface and the side surfaces. Especially, the front surface of the body 110 may be formed at the front case 111 and the rear surface thereof may be formed at the rear case 112. The side surfaces may be formed at both the front and rear cases 111 and 112. As shown, the inclination portion 118 may be formed between the front surface and the side surfaces of the front case 111.

The carrier 132, including the perpendicular surface 133a and the inclination surface 133b may have a prescribed shape, size, and position. The relative positioning of the carrier 132, including the corner part 133, to the body 110 may be set to provide a desired RF characteristics of the antenna module 132. For example, the length and angle of the inclination surface, as well as its distance from the conductive pattern unit 140 (see FIGS. 3 and 5), may be set to a prescribed value corresponding to a desired SAR. The positioning and relative angle of the conductive pattern unit 140 may also be configured for a desired SAR. As such, as the corner part 133 is spaced farther away from inclination portion 118 than other peripheries, the SAR due to the antenna unit 130 can be reduced.

Referring to FIGS. 3 and 5, the dongle device 100 may include a conductive pattern unit 140 (conductor assembly).

The conductive pattern unit 140 may be disposed at the case 111, 112 of the body 110 to disperse the SAR, and face the antenna unit 130. More particularly, the conductive pattern unit 140 may be formed at the inclination portion 118 of the front case 111.

The conductive pattern unit 140, for example, may include a conductor 141 mounted onto the inclination portion 118, and an external member 119a (external cover) may be mounted to the front case 111 to house the conductor 141. The SAR due to the radiator 131 of the antenna unit 130 may have a characteristic of being concentrated in a specific area. Hence, the structure that the conductive pattern unit 140 obscures the radiator 131 may allow dispersing of the SAR concentration. Here, the inclination portion 118 may be inclined at a prescribed angle based on the desired SAR characteristic.

Also, the conductive pattern unit 140 may be coupled to the antenna unit 130 so as to change at least one resonant frequency of the antenna unit 130. For example, the antenna unit 130 may have resonance points corresponding to LTE B17, LET B4 and WCDMA W1900, and the resonance point of LTE B4 is changed (moved). Consequently, the antenna performance can be improved and the reduction of the SAR can be achieved.

Referring to FIGS. 6 and 7, the antenna unit 130 may be provided with a ground conductor 134 disposed adjacent to the radiator 131.

The ground conductor 134 may have a prescribed shape and may be disposed to be spaced apart from the radiator 131 with a preset interval for allowing coupling to the radiator 131, and grounded to the circuit board 117. Accordingly, the antenna unit 130 may be implemented as a monopole antenna.

As shown in the drawings, the ground conductor 134 may include first and second parts 134a and 134b intersecting with each other. The first and second parts 134a and 134b may be in parallel to consecutive edges of the radiator 131, respectively. That is, the ground conductor 134 may be formed in a shape like "L." With the configuration, capacitors 135a and 135b may be disposed between the first and second parts 134a and 134b and the radiator 131, respectively.

The antenna pattern may move the resonance point of LTE B4 in cooperation with the conductive pattern unit 140, thereby reducing the SAR. If the second part 134b is not present, the number of capacitors 135b is decreased and a resonant frequency differs. Referring to FIG. 7, a capacitor 136 may be disposed between the first part 134a and a ground G of the second part 134b. Consequently, the similar resonance point to the case of non-existence of the second part 134b can be obtained. The capacitor 136 may be disposed on a transfer path of a wireless signal on the circuit board 117.

Figure 8A:
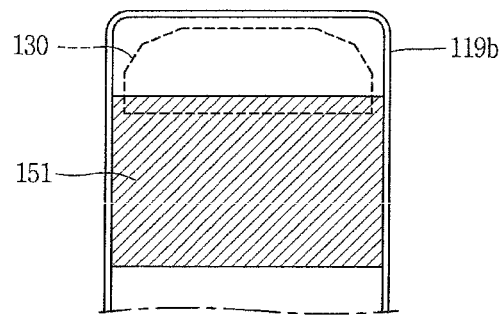
FIGS. 8A and 8B are overviews showing first and second conducting portions shown in FIG. 3.
Figure 8B:
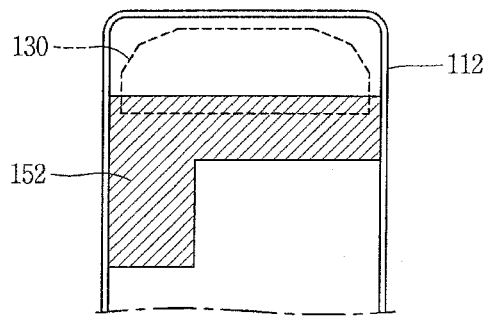

Hereinafter, a mechanism for further reducing the SAR will be described with reference to FIGS. 3, 8A and 8B. FIGS.

8A and 8B are overviews showing first and second conducting portions shown in FIG. 3, respectively.

Referring to FIG. 3, a conducting unit 150 (conductor assembly), on which a conductive material is deposited or plated, may be formed at the case of the body 110.

More particularly, an accommodation space for accommodating an external card therein may be formed at the rear case 112 of the body 110, and a cover 119b for housing the accommodation space may be mounted at the rear case 112. The conducting unit 150 may include a first conducting portion 152 (first conductor) formed on one surface of the rear case 112 and a second conducting portion 151 (second conductor) formed on the cover 119b.

The first and second conducting portions 152 and 151 may be formed in a manner of attaching a thin metal plate onto the rear case 112 and the cover 119b, as well as deposition or plating.

At least one of the first and second conducting portions 152 and 151 may be electrically connected to the circuit board 117 to expand the ground of the circuit board 117. As shown in FIGS. 8A and 8B, the first and second conducting portions 152 and 151 may be disposed to be overlapped with a part of the antenna unit 130, respectively.

Low and high resonant frequency bands may change depending on an overlapped length between each of the first and second conducting portions 152 and 152 and the antenna unit 130, and accordingly an antenna gain is decreased. However, this structure may provide the characteristic of more reducing the SAR. In the structure, as the ground is expanded, power feeding to the antenna unit 130 may be blocked and a field is widely distributed. Also, the first conducting portion 152 primarily blocks the power feeding and the second conducting portion 151 secondarily blocks it, so the SAR reduction effect can be increased, as compared with the lowering of a total radiated power (TRP).

Figure 9:
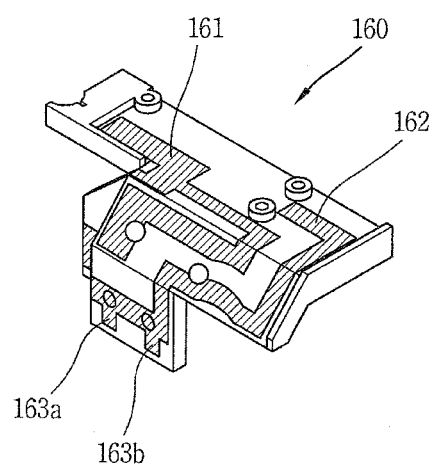
FIG. 9 is an enlarged planar view of a part A of FIG. 3 for showing an auxiliary antenna unit, respectively.

Hereinafter, another mechanism for more reducing the SAR will be described with reference to FIGS. 3 and 9. FIG. 9 is an enlarged planar view of a part A of FIG. 3 for showing an auxiliary antenna unit.

As shown in FIGS. 3 and 9, an auxiliary antenna unit 160 (auxiliary antenna assembly) may be disposed adjacent to the interface unit 113. The auxiliary antenna unit 160 may be configured to send and receive wireless signals with multi-frequency bands.

Referring to FIG. 9, the auxiliary antenna unit 160 may include first and second patterns 161 and 162. The first and second patterns 161 and 162 may be connected to each other and also connected to the circuit board 117 via a power feeding connection portion 163a and a ground connection portion 163b, respectively. According to this structure, the auxiliary antenna unit 160 may be an antenna for sending and receiving wireless signals with multi-frequency bands.

The multi-frequency bands may be frequency bands corresponding to GPS and PCS, for example. Although the PCS band is added to the GPS band, the SAR can be reduced with maintaining the TRP at the same level.

Referring to FIG. 3, a metal plate 171 for heat radiation may be mounted to the circuit board 117. The metal plate 171 may be configured to obscure the circuit hoard 117 so the of affection of electromagnetic waves to the front surface of the front case 111 can be reduced.

The metal plate 171 may be electrically connected to the auxiliary antenna 160 to form a ground of the auxiliary antenna unit 160. Accordingly, the metal plate 171 may be utilized as a ground area for a PCS resonance length of the auxiliary antenna unit 160.

Figure 10:
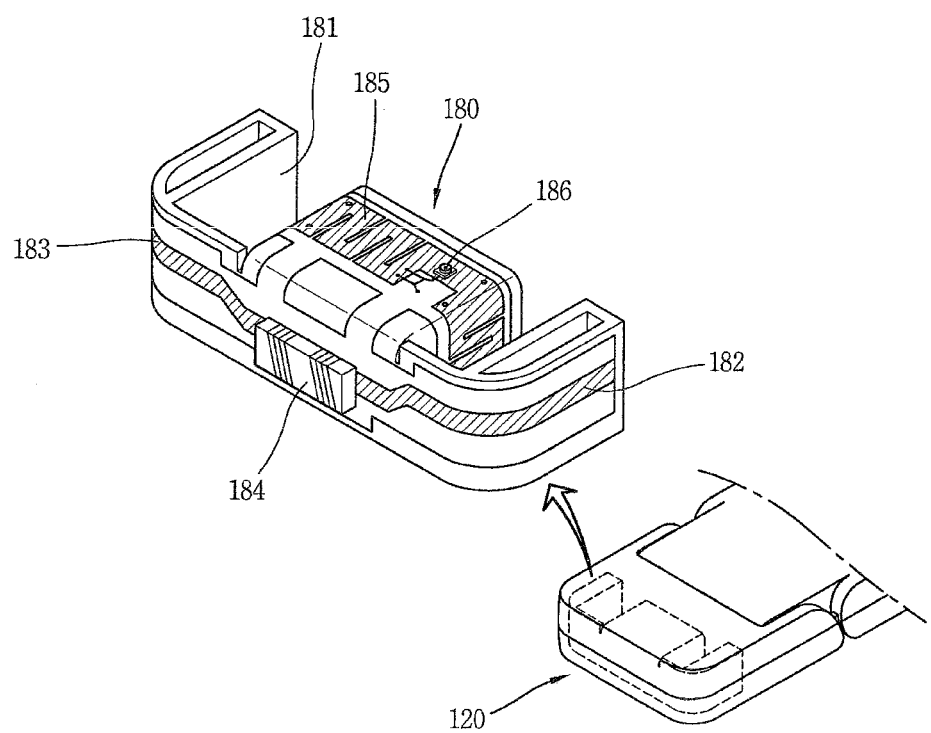
FIG. 10 is a disassembled view of a cover body of FIG. 1.

Hereinafter the cover body 120 will be described with reference to FIG. 10. FIG. 10 is a disassembled view of the cover body 120 of FIG. 1.

As shown in FIG. 10, a second antenna unit 180 (second antenna assembly) for receiving wireless signals with multi-frequency bands may be mounted in the cover body 120. The second antenna unit 180 may include a plurality of conductive radiators 182 and 183 mounted to the carrier 181, and a chip antenna 184 disposed between the plurality of conductive radiators 182 and 183. With this structure, the second antenna unit 180 may be implemented as a high dielectric mixed antenna (HDMA).

The plurality of conductive radiators 182 and 183 may receive wireless signals with high and low frequency bands, respectively. The plurality of conductive radiators 182 and 183 may be connected to the chip antenna 184, respectively. The chip antenna 184 may be a high dielectric chip having a helical pattern.

Also, as shown in FIG. 10, a second conductor may be configured such that the conductive radiators 182 and 183 and the chip antenna 184 are disposed on a flexible printed circuit board (FPCB). In addition, a ground 185 may be formed on another surface of the carrier 181 intersecting with the one surface thereof, on which the conductive radiators 182 and 183 are disposed. The chip antenna 184 may be electrically connected to the ground 185. A radio frequency (RF) connection terminal 186 may be mounted to a part of the ground 185, and accordingly, the second antenna unit 180 can be connected to the circuit board 117 (see FIG. 3) using an RF cable.

With the structure, the second antenna unit 180, for example, may have resonant frequencies corresponding to LTE B17 RX, LTE B4 RX and LTE B7, thereby implementing a 2nd MIMO antenna on the cover body 120.

Figure 11A:
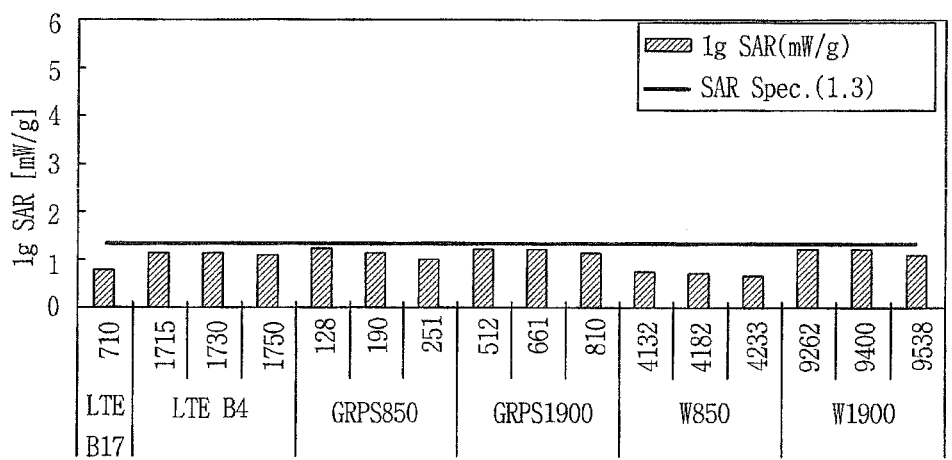
FIGS. 11A and 11B are experimental graphs respectively showing a specific absorption rate and a wireless efficiency of the dongle device.
Figure 11B:
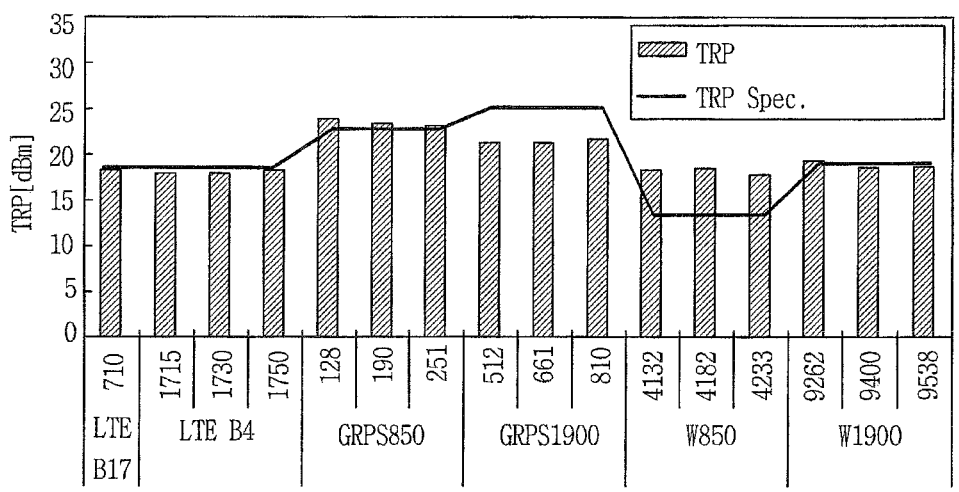

FIGS. 11A and 11B are experimental graphs respectively showing a specific absorption rate and a wireless efficiency of the dongle device.

The dongle device, as shown in FIG. 11A, exhibits the SAR lower than about 1.3 mW/g at each frequency band. Contrarily, as shown in FIG. 11B, it exhibits the TRP of 17 to 23 dBm, from which it can be seen in the dongle device that the SAR can be reduced with maintaining the antenna performance (efficiency).

With the configuration of the dongle device, as a part of the carrier is getting farther away from the case, the SAR due to the antenna unit can be reduced. Also, the combination of the radiator and the ground conductor allows control of resonant frequencies of the antenna unit.

Also, the conductive pattern unit can obviate concentration of the SAR, and allow change of the resonant frequency.

In addition, as the conducting unit is overlapped with a part of the antenna unit, a mechanism can be implemented by which a great reduction of the SAR can be achieved with less lowering the function of the antenna.

The foregoing embodiments and advantages of the constructions and methods are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

Therefore, an aspect of the detailed description is to provide a dongle device capable of transmitting and receiving wireless signals and having lower specific absorption rate (SAR).

To achieve these and other advantages of the detailed description, as embodied and broadly described herein, there is provided a dongle device including a body having a bar-like shape, an interface unit mounted to the body and configured to be attachable to a connection part of a portable device, an antenna unit mounted in the body to be adjacent to one end of the body, and configured to transmit and receive wireless signals for allowing wireless communications in the portable device, and a circuit board connected to the antenna unit to process the wireless signals and connected to the interface unit, wherein the antenna unit includes a radiator configured to receive or radiate electromagnetic waves corresponding to the wireless signals, and a carrier placed on the radiator, at least a portion of the carrier being recessed to be farther away from the case of the body than other portions thereof so as to reduce a specific absorption rate (SAR) due to the antenna unit around the body.

In accordance with one aspect, wherein the carrier may have a front surface and side surfaces connected to each other by virtue of a corner part, and the corner part may be recessed in a direction to be farther away from the case. The corner part may include a perpendicular surface formed perpendicular to the front surface, and an inclination surface connecting the perpendicular surface to the side surfaces and inclined with respect to the front surface and the side surfaces. The case may have a front surface, a rear surface and side surfaces, and be provided with an inclination portion facing the corner part between the front surface and the side surfaces.

In accordance with another aspect, the radiator may be electrically connected to the circuit board such that power can be fed from the circuit board, and a ground conductor grounded to the circuit board may be disposed adjacent to the radiator. The ground conductor may include first and second parts intersecting with each other, and the first and second parts may be in parallel to consecutive edges of the radiator. A capacitor may be disposed between the first part and the ground of the antenna unit.

In accordance with another aspect, the dongle device may include a conductive pattern unit. The conductive pattern unit may be disposed on the case of the body to disperse the SAR and face the antenna unit. The conductive pattern unit may include a conductor mounted onto one surface of the case, and an external member may be attached onto the case to obscure the conductor. The case may have a front surface, a rear surface and side surfaces, and be provided with an inclination portion formed between the front surface and the side surfaces and inclined with respect to the front surface and the side surfaces. The conductor may be mounted onto the inclination portion. The conductive pattern unit may be coupled to the antenna unit to change at least one of resonant frequencies of the antenna unit.

In accordance with another aspect, the case of the body may include a conducting unit having a surface deposited or plated with a conductive material and overlapped with a part of the antenna unit. The case may include a front case and a rear case, and the conducting unit may include a first conducting portion formed on one surface of the rear case. The rear case may include an accommodation space for accommodating an external card therein, and a cover mounted to house the accommodation space, and the cover may include a second conducting portion overlapped with a part of the antenna unit. At least one of the first and second conducting portions may be electrically connected to the circuit board to expand a ground of the circuit board.

In accordance with another aspect, the interface unit may be mounted to another end of the body, and a cover body for opening and closing the interface unit may be mounted to the body to be rotatable based upon an axis in parallel to the interface unit. The dongle device may include an auxiliary antenna unit disposed adjacent to the interface unit, and the auxiliary antenna unit may be configured to transmit and receive wireless signals with multi-frequency bands.

In accordance with another aspect, a metal plate for heat radiation may be mounted to the circuit board, and the metal plate may be electrically connected to the auxiliary antenna unit to form a ground of the auxiliary antenna unit. The another end of the body may include a center part having the interface unit and an edge part recessed from the center part toward the antenna unit and formed to be stepped with respect to the center part. The cover body may be rotatably coupled to both side surfaces of the center part, and rotation thereof may be limited by the edge part.

In accordance with another aspect, a second antenna unit for receiving wireless signals with multi-frequency bands may be mounted in the cover body. The second antenna unit may include a plurality of conductive radiators formed in correspondence with different frequency bands, and a chip antenna disposed between the plurality of conductive radiators.

The foregoing and other objects, features, aspects and advantages of the present disclosure will become more apparent from the following detailed description of the present disclosure when taken in conjunction with the accompanying drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A data communication device comprising:
    a body;
    an antenna assembly provided in the body, and configured to transmit or receive wireless signals;

a circuit board connected to the antenna assembly and configured to process the wireless signals, a data interface provided on the body, and an auxiliary antenna assembly disposed adjacent to the data interface, wherein the antenna assembly includes a carrier having a first surface facing a front surface of the body, a second surface facing a side surface of the body, and recessed surfaces provided between the first and second surfaces of the carrier that are recessed to be farther away from the body than the first surface and the second surface of the carrier, and a radiator provided on the recessed surfaces of the carrier wherein the recessed surfaces include a first recessed surface positioned adjacent to the first surface of the carrier and perpendicular to the first surface of the carrier, and a second recessed surface positioned adjacent to the first recessed surface and the second surface of the carrier and inclined at a prescribed angle relative to the second surface of the carrier and is stepped from the first surface and forms a stepped portion along a length of the first recessed surface, wherein the antenna assembly further includes a ground conductor provided adjacent to the radiator and grounded to the circuit board, wherein the ground conductor has a first part and a second part that intersect with each other at a prescribed angle, the first and second parts being parallel to consecutive edges of the radiator, respectively, wherein the data interface is a data port positioned in a region of the body opposite to the antenna assembly, wherein a cover is rotatably mounted to the body to cover the data port, wherein a metal plate is provided on the circuit board to dissipate heat from the circuit board, and is electrically connected to the auxiliary antenna assembly to form a ground for the auxiliary antenna assembly, and wherein the auxiliary antenna assembly includes first and second patterns connected to each other and also connected to the circuit board via a power feeding connection portion and a ground connection portion, respectively.

2. The device of claim 1, wherein the body includes a case that has the front surface, a rear surface, the side surface, and an inclined surface positioned between the front surface and the side surface, and wherein the inclined surface of the body is inclined at a second prescribed angle such that the inclined surface faces the recessed surface of the carrier.

3. The device of claim 1, wherein a capacitor is connected in series between the ground conductor and a ground.

4. The device of claim 1, wherein a conductor assembly is disposed on the body to face the antenna.

5. The device of claim 4, wherein the conductor assembly includes a conductor mounted on an inclined surface of the body and an external cover attached to the body to cover the conductor.

6. The device of claim 5, wherein the body includes a case having a front surface, a rear surface, a plurality of side surfaces, and the inclined surface, wherein the inclined surface is positioned between the front surface and at least one of the plurality of side surfaces, and wherein the inclined surface of the body is inclined to face the recessed surface of the carrier.

7. The device of claim 4, wherein the conductor assembly is coupled to the antenna assembly to change at least one resonant frequency of the antenna assembly.

8. The device of claim 1, wherein the body includes a conductor assembly having at least one surface deposited or plated with a conductive material, the conductor assembly being positioned to spatially overlap at least a portion of the antenna assembly.

9. The device of claim 8, wherein the body includes a front case and a rear case, and wherein one of the at least one surface having the conductive material is a surface on the rear case.

10. The device of claim 9, wherein the rear case is formed to house an external card, and a cover is positioned over the rear case to correspond to the external card, and wherein another one of the at least one surface having the conductive material is a surface on the cover positioned to spatially overlap at least a portion of the antenna assembly.

11. The device of claim 10, wherein one or more of the at least one surface having the conducting material is grounded to the circuit board.

12. The device of claim 1, wherein the region of the body in which the data port is positioned includes a first and second recessed surfaces which are positioned on opposite side surfaces of the body and formed to recede toward each other.

13. The device of claim 12, wherein the cover is rotatably coupled to the body at the first and second recessed surfaces, and wherein a range of rotation of the cover is limited by the body.

14. The device of claim 1, wherein a second antenna assembly is mounted in the body.

15. The device of claim 14, wherein the second antenna assembly includes a plurality of conductive radiators, and a chip antenna disposed between the plurality of conductive radiators.

* * * * *